(12) United States Patent
Matsuda (10) Patent No.: US 12,413,204 B2
(45) Date of Patent: Sep. 9, 2025

(54) ACOUSTIC WAVE DEVICE, FILTER, AND MULTIPLEXER

(71) Applicant: TAIYO YUDEN CO., LTD., Tokyo (JP)

(72) Inventor: Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 316 days.

(21) Appl. No.: 18/170,944

(22) Filed: Feb. 17, 2023

(65) Prior Publication Data

US 2023/0275566 A1    Aug. 31, 2023

(30) Foreign Application Priority Data

Feb. 25, 2022 (JP) ................. 2022-027876

(51) Int. Cl.
| | |
|---|---|
| *H03H 9/17* | (2006.01) |
| *H03H 9/02* | (2006.01) |
| *H03H 9/13* | (2006.01) |
| *H03H 9/56* | (2006.01) |
| *H03H 9/70* | (2006.01) |

(52) U.S. Cl.
CPC .......... *H03H 9/173* (2013.01); *H03H 9/133* (2013.01); *H03H 9/568* (2013.01); *H03H 9/706* (2013.01); *H03H 9/02031* (2013.01)

(58) Field of Classification Search
CPC ........ H03H 9/173; H03H 9/133; H03H 9/568; H03H 9/706; H03H 9/02031; H03H 9/02157; H03H 9/175; H03H 9/02015

USPC .................................................. 333/187, 188
See application file for complete search history.

(56) References Cited

U.S. PATENT DOCUMENTS

| | | | |
|---|---|---|---|
| 9,065,421 B2 * | 6/2015 | Feng | ........... H03H 9/585 |
| 2004/0124953 A1 | 7/2004 | Nakatani et al. | |
| 2019/0326878 A1 * | 10/2019 | Kakita | ........... H03H 9/6483 |

FOREIGN PATENT DOCUMENTS

| | | |
|---|---|---|
| JP | S49-25883 A | 3/1974 |
| JP | S64-71207 A | 3/1989 |
| JP | H3-123214 A | 5/1991 |
| JP | H7-254836 A | 10/1995 |
| JP | H10-51262 A | 2/1998 |
| JP | 2004-146861 A | 5/2004 |

* cited by examiner

*Primary Examiner* — Jorge L Salazar, Jr.
(74) *Attorney, Agent, or Firm* — CHEN YOSHIMURA LLP (57) ABSTRACT

An acoustic wave device includes a first piezoelectric layer that is a rotated Y-cut lithium tantalate substrate and has a first thickness, a second piezoelectric layer that is a rotated Y-cut lithium niobate substrate, is stacked on the first piezoelectric layer, has a second thickness that is less than the first thickness, and has a spontaneous polarization direction that is substantially opposite to a spontaneous polarization direction of the first piezoelectric layer, a first electrode provided on an opposite surface of the first piezoelectric layer from the second piezoelectric layer, and a second electrode that is provided on an opposite surface of the second piezoelectric layer from the first piezoelectric layer, at least a part of the first piezoelectric layer and at least a part of the second piezoelectric layer being interposed between the first electrode and the second electrode.

10 Claims, 12 Drawing Sheets

| θ = 158° | | |
|---|---|---|
| Ta/Tb | k² [%] | k² / k²(Ta/Tb = 1) |
| 0.540 | 1.890 | 1.000 |
| 0.560 | 1.512 | 0.800 |
| 0.583 | 1.134 | 0.600 |
| 0.596 | 0.944 | 0.500 |
| 0.611 | 0.756 | 0.400 |
| 0.649 | 0.378 | 0.200 |
| 0.699 | 0.100 | 0.053 |
| 0.783 | 0.100 | 0.053 |
| 0.841 | 0.378 | 0.200 |
| 0.891 | 0.756 | 0.400 |
| 0.912 | 0.944 | 0.500 |
| 0.932 | 1.134 | 0.600 |
| 0.967 | 1.512 | 0.800 |
| 1.000 | 1.890 | 1.000 |

| θ = 163° | | |
|---|---|---|
| Ta/Tb | k² [%] | k² / k²(Ta/Tb = 1) |
| 0.516 | 2.307 | 1.000 |
| 0.538 | 1.845 | 0.800 |
| 0.563 | 1.384 | 0.600 |
| 0.577 | 1.153 | 0.500 |
| 0.592 | 0.923 | 0.400 |
| 0.632 | 0.461 | 0.200 |
| 0.689 | 0.100 | 0.043 |
| 0.769 | 0.100 | 0.043 |
| 0.835 | 0.461 | 0.200 |
| 0.887 | 0.923 | 0.400 |
| 0.909 | 1.154 | 0.500 |
| 0.929 | 1.384 | 0.600 |
| 0.966 | 1.845 | 0.800 |
| 1.000 | 2.307 | 1.000 |

| θ = 168° | | |
|---|---|---|
| Ta/Tb | k² [%] | k² / k²(Ta/Tb = 1) |
| 0.504 | 2.584 | 1.000 |
| 0.527 | 2.067 | 0.800 |
| 0.552 | 1.551 | 0.600 |
| 0.567 | 1.292 | 0.500 |
| 0.583 | 1.034 | 0.400 |
| 0.624 | 0.517 | 0.200 |
| 0.685 | 0.100 | 0.039 |
| 0.763 | 0.100 | 0.039 |
| 0.833 | 0.517 | 0.200 |
| 0.885 | 1.034 | 0.400 |
| 0.907 | 1.292 | 0.500 |
| 0.928 | 1.551 | 0.600 |
| 0.965 | 2.067 | 0.800 |
| 1.000 | 2.584 | 1.000 |

ACOUSTIC WAVE DEVICE, FILTER, AND MULTIPLEXER

FIELD

A certain aspect of the present disclosure relates to an acoustic wave device, a filter, and a multiplexer.

BACKGROUND

Bulk acoustic wave (BAW) resonators such as film bulk acoustic resonators (FBARs) and solid mounted resonators (SMRs) are used as filters and duplexers for high-frequency circuits of wireless terminals such as mobile phones. The BAW resonator is called a piezoelectric thin film resonator. The piezoelectric thin film resonator has a structure in which a pair of electrodes are provided with a piezoelectric layer interposed therebetween, and a resonance region where the pair of electrodes face each other across at least a part of the piezoelectric layer is a region where acoustic waves resonate. It is known that two piezoelectric layers having opposite spontaneous polarization directions are stacked as a piezoelectric layer as disclosed in, for example, Japanese Patent Application Laid-Open Nos. S64-71207, 549-25883, H3-123214, H10-51262, and H7-254836 (Patent Documents 1 to 5, respectively). It is known to use a monocrystalline lithium niobate substrate and a monocrystalline lithium tantalate substrate as the two piezoelectric layers to be stacked (for example, Patent Document 5).

RELATED ART DOCUMENTS

Patent Documents

Japanese Patent Application Laid-Open No. S64-71207
Japanese Patent Application Laid-Open No. S49-25883
Japanese Patent Application Laid-Open No. H3-123214
Japanese Patent Application Laid-Open No. H10-51262
Japanese Patent Application Laid-Open No. H7-254836

SUMMARY

By stacking piezoelectric layers with spontaneous polarization directions opposite to each other, it is possible to excite the second-harmonic acoustic wave. When the second-harmonic acoustic wave is used as the main mode, the fundamental wave becomes an unnecessary wave. In the case that one of the stacked piezoelectric layers is a rotated Y-cut lithium niobate substrate and the other is a rotated Y-cut lithium tantalate substrate, it is required to inhibit excitation of the fundamental wave, which is an unnecessary wave.

An object of the present disclosure is to reduce unnecessary waves.

In one aspect of the present disclosure, there is provided an acoustic wave device including: a first piezoelectric layer that is a rotated Y-cut lithium tantalate substrate and has a first thickness; a second piezoelectric layer that is a rotated Y-cut lithium niobate substrate, is stacked on the first piezoelectric layer, has a second thickness that is less than the first thickness, and has a spontaneous polarization direction that is substantially opposite to a spontaneous polarization direction of the first piezoelectric layer; a first electrode provided on an opposite surface of the first piezoelectric layer from the second piezoelectric layer; and a second electrode that is provided on an opposite surface of the second piezoelectric layer from the first piezoelectric layer, at least a part of the first piezoelectric layer and at least a part of the second piezoelectric layer being interposed between the first electrode and the second electrode.

In the above acoustic wave device, the first piezoelectric layer may be a 1580 or greater and 168° or less rotated Y-cut lithium tantalate substrate, the second piezoelectric layer may be a 1580 or greater and 168° or less rotated Y-cut lithium niobate substrate, and the second thickness may be equal to or greater than 0.5 times the first thickness.

In the above acoustic wave device, the second thickness may be equal to or greater than 0.56 times the first thickness and is equal to or less than 0.92 times the first thickness.

In the above acoustic wave device, the second thickness may be equal to or greater than 0.68 times the first thickness and is equal to or less than 0.78 times the first thickness.

In the above acoustic wave device, an angle between an X-axis orientation of crystal orientations of a rotated Y-cut lithium tantalate substrate in the first piezoelectric layer and an X-axis orientation of crystal orientations of a rotated Y-cut lithium niobate substrate in the second piezoelectric layer may be 5° or less.

In the above acoustic wave device, the first piezoelectric layer and the second piezoelectric layer may be directly bonded to each other.

The above acoustic wave device may further include a support substrate, and the first piezoelectric layer may be provided between the support substrate and the second piezoelectric layer.

The above acoustic wave device may further include a support substrate, and the second piezoelectric layer may be provided between the support substrate and the first piezoelectric layer.

In another aspect of the present disclosure, there is provided a filter including the above acoustic wave device.

In another aspect of the present disclosure, there is provided a multiplexer including the above filter.

DETAILED DESCRIPTION

Hereinafter, embodiments of the present disclosure will be described with reference to the drawings.

First Embodiment

A piezoelectric thin film resonator will be described as an example of the acoustic wave device.

Figure 1A:
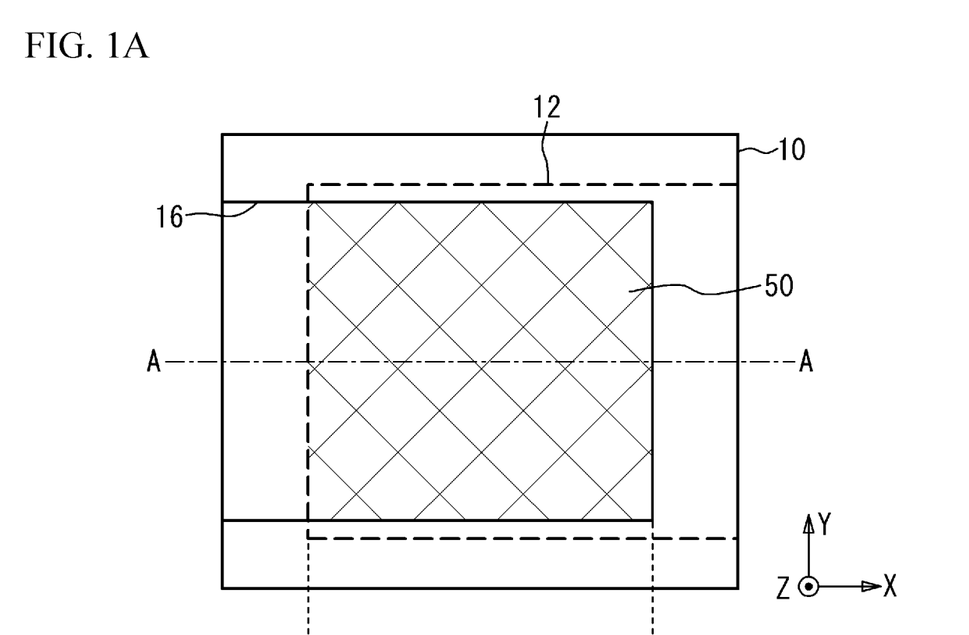
FIG. 1A is a plan view of a piezoelectric thin film resonator in accordance with a first embodiment.
Figure 1B:
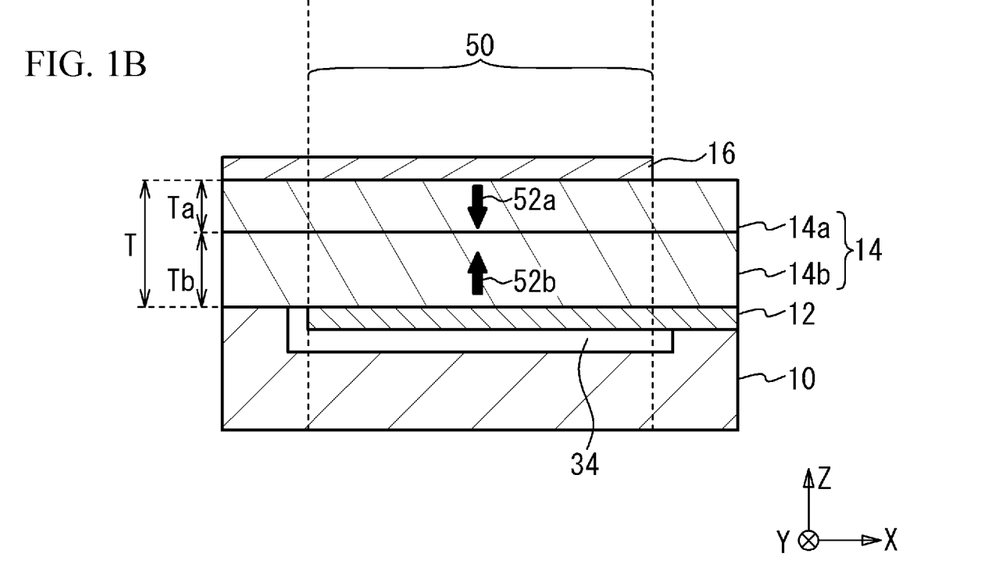
FIG. 1B is a cross-sectional view taken along a line A-A in FIG. 1A.

FIG. 1A is a plan view of a piezoelectric thin film resonator in accordance with a first embodiment, and FIG. 1B is a cross-sectional view taken along line A-A in FIG. 1A. A stacking direction of piezoelectric layers 14a and 14b is defined as a Z direction, a direction in which a lower electrode 12 is extracted is defined as an X direction, and a direction orthogonal to the X direction and the Z direction is defined as a Y direction.

As illustrated in FIG. 1A and FIG. 1B, a piezoelectric layer 14 is provided on a substrate 10. The piezoelectric layer 14 includes the piezoelectric layers 14a and 14b that are stacked. The thicknesses of the piezoelectric layers 14a and 14b are Ta and Tb, respectively. The thickness of the piezoelectric layer 14 is T. The piezoelectric layer 14a is a rotated Y-cut lithium niobate (LiNbO$_3$) substrate, and the piezoelectric layer 14b is a rotated Y-cut lithium tantalate (LiTaO$_3$) substrate. A polarization direction 52a of the piezoelectric layer 14a is the downward direction. A polarization direction 52b of the piezoelectric layer 14b is the upward direction, and the piezoelectric layers 14a and 14b are directly bonded to each other using, for example, a surface-activation method. When the piezoelectric layers 14a and 14b are bonded to each other using the surface-activation method, an amorphous layer may be formed between the piezoelectric layers 14a and 14b. In this case, since the thickness of the amorphous layer is sufficiently smaller than those of the piezoelectric layers 14a and 14b, it can be considered that the piezoelectric layers 14a and 14b are directly bonded to each other.

An upper electrode 16 and the lower electrode 12 are provided on and below the piezoelectric layer 14, respectively. A region where the lower electrode 12 and the upper electrode 16 overlap in a plan view with at least a part of the piezoelectric layer 14a and at least a part of the piezoelectric layer 14b interposed therebetween in the stacking direction is a resonance region 50. An air gap 34 is provided between the substrate 10 and the lower electrode 12. The acoustic wave is reflected by the interface between the lower electrode 12 and the air gap 34. In a plan view, the air gap 34 overlaps with the resonance region 50, and the air gap 34 has the same size as the resonance region 50 or is larger than the resonance region 50.

The substrate 10 is, for example, a silicon substrate, a sapphire substrate, an alumina substrate, a spinel substrate, a quartz substrate, a crystal substrate, a glass substrate, a ceramic substrate, a GaAs substrate, or the like. Each of the lower electrode 12 and the upper electrode 16 is, for example, a single-layer film of ruthenium (Ru), chromium (Cr), aluminum (Al), titanium (Ti), copper (Cu), molybdenum (Mo), tungsten (W), tantalum (Ta), platinum (Pt), rhodium (Rh), iridium (Ir), or the like, or a multilayer film in which these films are stacked.

Figure 2A:
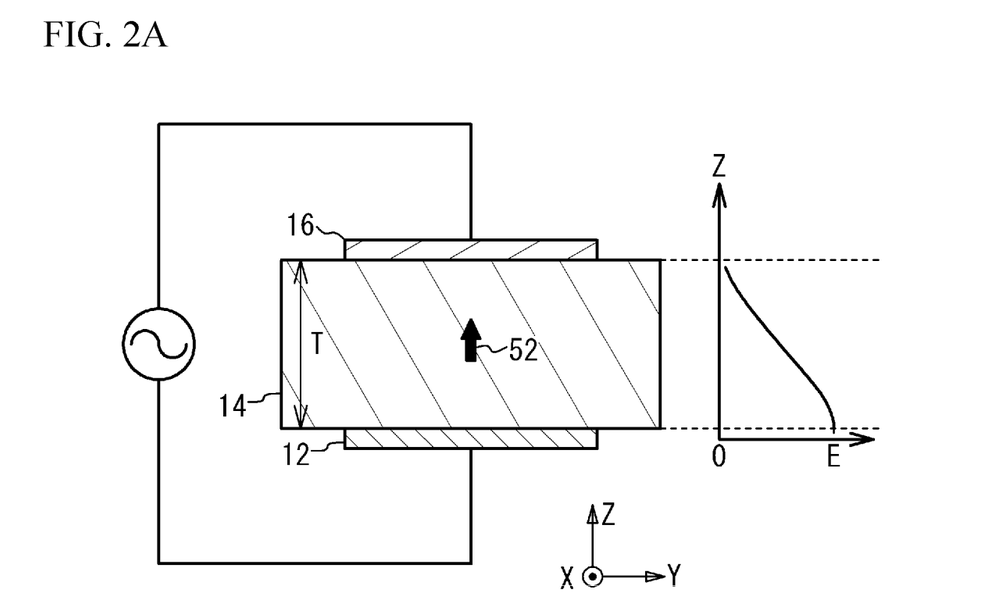
FIG. 2A and FIG. 2B are views for describing the operations of the piezoelectric thin film resonators in a first comparative example and the first embodiment, respectively.
Figure 2B:
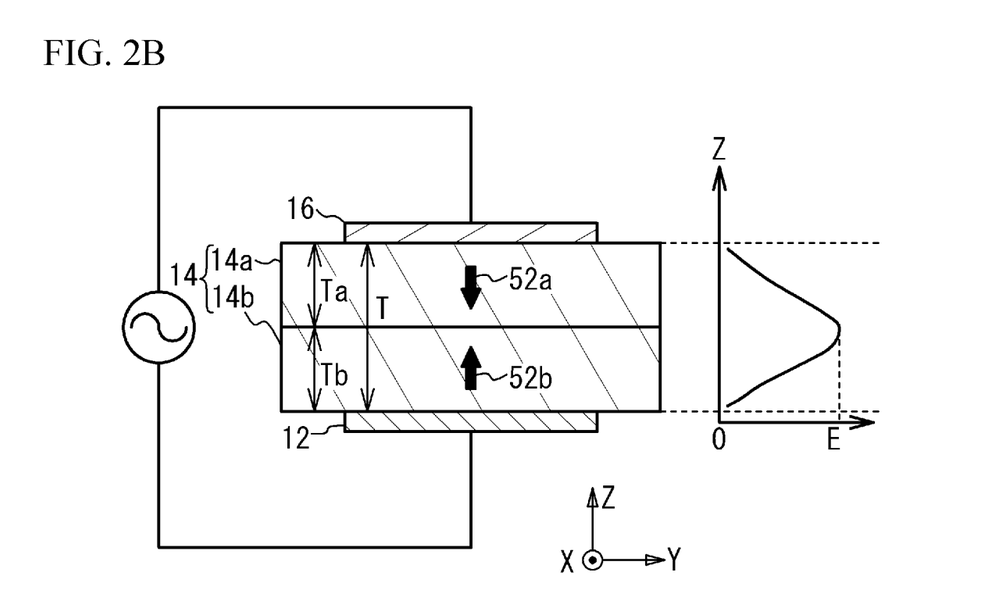

FIG. 2A and FIG. 2B are views for describing the operations of the piezoelectric thin film resonators in a first comparative example and the first embodiment, respectively. In FIG. 2A and FIG. 2B, the lower electrode 12, the piezoelectric layer 14, and the upper electrode 16 are illustrated. The graph on the right side illustrates the displacement of the acoustic wave with respect to the position in the Z direction. In FIG. 2B, the thicknesses Ta and Tb are illustrated as being equal to each other for the sake of simplicity.

As illustrated in FIG. 2A, in the first comparative example, the piezoelectric layer 14 is one piezoelectric layer in which a polarization direction 52 is one direction. In this case, as illustrated in the graph on the right side, in the fundamental wave, when the displacement of the upper surface of the piezoelectric layer 14 is 0, the displacement of the lower surface of the piezoelectric layer 14 becomes E. Thus, in the fundamental wave, the potential of the lower electrode 12 and the potential of the upper electrode 16 are different from each other, and when an AC signal having a predetermined frequency is applied between the lower electrode 12 and the upper electrode 16, the fundamental wave is excited in the piezoelectric layer 14. On the other hand, in the second harmonic, the potential of the lower electrode 12 and the potential of the upper electrode 16 are substantially the same. Therefore, the second harmonic is hardly excited in the piezoelectric layer 14. The thickness T of the piezoelectric layer 14 is approximately ½ of the wavelength of the fundamental wave. To manufacture a piezoelectric thin film resonator having a high resonant frequency, the thickness T of the piezoelectric layer 14 is reduced. However, since the air gap 34 exists between the piezoelectric layer 14 and the support substrate, when the piezoelectric layer 14 is made thin, the piezoelectric layer 14 is likely to break. In addition, because of manufacturing variations in the thickness T of the piezoelectric layer 14, characteristics such as the resonant frequency are likely to vary.

As illustrated in FIG. 2B, in the first embodiment, the polarization direction 52a of the piezoelectric layer 14a is the downward direction, and the polarization direction 52b of the piezoelectric layer 14b is the upward direction. As illustrated in the graph on the right side, in the second harmonic, when the displacement of the upper surface of the piezoelectric layer 14 is 0, the displacement of the lower surface of the piezoelectric layer 14 is 0. The displacement near the center of the piezoelectric layer 14 in the Z direction is E. Since the polarization direction 52a of the piezoelectric layer 14a and the polarization direction 52b of the piezoelectric layer 14b are opposite to each other, the potentials of the lower electrode 12 and the upper electrode 16 are different from each other in the second harmonic. Therefore, when an AC current having a predetermined frequency is applied between the lower electrode 12 and the upper electrode 16, the second harmonic is excited. On the other hand, in the fundamental wave, the potential of the lower electrode 12 and the potential of the upper electrode 16 are substantially the same. Therefore, the fundamental wave is hardly excited in the piezoelectric layer 14. The thickness T is approximately the wavelength of the second harmonic. For this reason, when the piezoelectric thin film resonator having the same resonant frequency as the piezoelectric film of the first comparative example is manufactured, the thickness T of the piezoelectric layer 14 in the first embodiment can be about twice that in the first comparative example. As a result, breakage of the piezoelectric layer 14 can be inhibited. In addition, variations in characteristics such as a resonant frequency can be reduced.

When lithium tantalate substrates having a rotation cut angle of 163° or lithium niobate substrates having a rotation cut angle of 163° is used for the piezoelectric layers 14a and 14b, thickness-shear vibration is excited in the piezoelectric layer 14. The vibration direction of the thickness shear vibration is the Y direction. In addition, thickness extension vibration is hardly excited in the piezoelectric layer 14. Therefore, when the thickness shear vibration is the main mode, the rotation cut angle is preferably 163°.

When the piezoelectric layers 14a and 14b are made of the same material, the piezoelectric characteristics are determined by the material. Therefore, by adopting a lithium tantalate substrate as the piezoelectric layer 14a and a lithium niobate substrate as the piezoelectric layer 14b, the piezoelectric characteristics such as the electromechanical coupling coefficient $k^2$ can be adjusted to be between the piezoelectric characteristics obtained when the piezoelectric layers 14a and 14b are lithium tantalate substrates and the piezoelectric characteristics obtained when the piezoelectric layers 14a and 14b are lithium niobate substrates.

Figure 3:
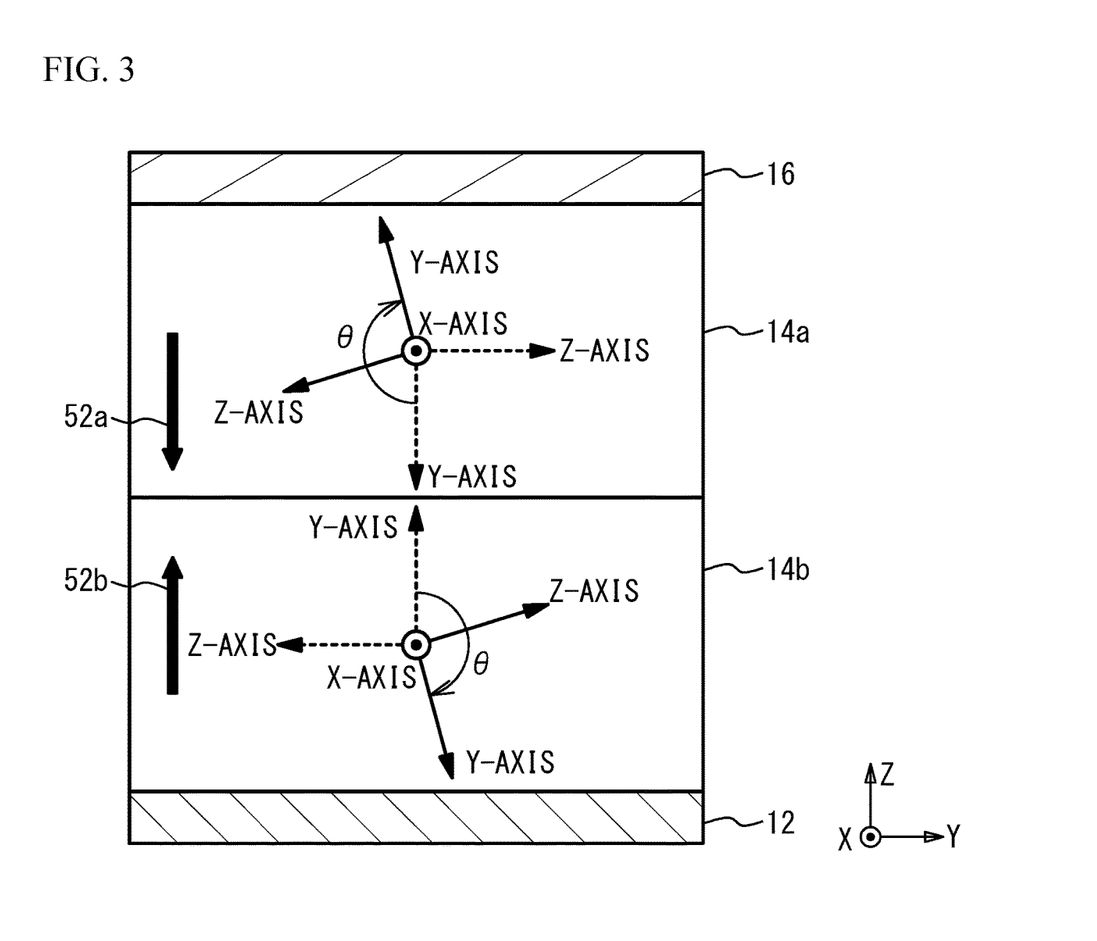
FIG. 3 illustrates the crystal orientations of a piezoelectric layer in the first embodiment.

FIG. 3 illustrates the crystal orientations of the piezoelectric layer in the first embodiment. The X-axis orientation, the Y-axis orientation, and the Z-axis orientation are axial orientations of the crystal orientations, and the X direction, the Y direction, and the Z direction are directions presented in FIG. 1A and FIG. 1B. A 163° rotated Y-cut lithium niobate substrate is used as the piezoelectric layer 14a, and a 163° rotated Y-cut lithium tantalate substrate is used as the piezoelectric layer 14b.

As illustrated in FIG. 3, the +X-axis orientation of the crystal orientations of the piezoelectric layer 14a and the +X-axis orientation of the crystal orientations of the piezoelectric layer 14b are substantially the same orientation, which is the X direction. In the piezoelectric layer 14a, the +Y-axis orientation and the +Z-axis orientation are adjusted to be the −Z direction and the +Y direction, respectively, as indicated by broken line arrows. The Y-axis and the Z-axis are rotated around the X-axis by θ=163° from the +Z-axis orientation toward the +Y-axis orientation. The lithium tantalate substrate and the lithium niobate substrate have crystal structures similar to trigonal ilmenite, and the +Z-axis orientation thereof corresponds to the c-axis orientation of the crystal orientations. The +Z-axis orientation is the spontaneous polarization direction. In this case, the upper surface and the lower surface of the piezoelectric layer 14a are referred to as a negative (−) surface and a positive (+) surface, respectively, and the polarization direction 52a is illustrated downward.

In the piezoelectric layer 14b, the +Y-axis orientation and the +Z-axis orientation are adjusted to be the +Z direction and the −Y direction, respectively, as indicated by dashed arrows. The Y-axis and the Z-axis are rotated around the X-axis by θ=163° from the +Z-axis orientation toward the +Y-axis orientation. The +Z-axis orientation in this case corresponds to the c-axis orientation of the crystal orientations. The +Z-axis orientation is the spontaneous polarization direction. In this case, the upper surface and the lower surface of the piezoelectric layer 14b are referred to as a positive (+) surface and a negative (−) surface, respectively, and the polarization direction 52b is illustrated upward. The spontaneous polarization directions of the piezoelectric layers 14a and 14b can be confirmed by identifying the Z-axis orientation using an X-ray diffraction method.

Spontaneous polarization is a state of polarization in a state where no electric field is applied. In lithium tantalate, Li and Ta are cations, and O is an anion. If atoms of Li, Ta, and O are positioned so as to cancel electric charges, spontaneous polarization does not occur. Since these atoms are displaced from the positions where the electric charges are canceled out, spontaneous polarization occurs. Spontaneous polarization also occurs in lithium niobate.

By adjusting the +X-axis orientation of the piezoelectric layer 14a and the +X-axis orientation of the piezoelectric layer 14b to be substantially the same direction, the spontaneous polarization direction (+Z-axis orientation) of the piezoelectric layer 14a and the spontaneous polarization direction (+Z-axis orientation) of the piezoelectric layer 14b become substantially opposite directions. For example, when the +X-axis orientation of the piezoelectric layer 14a and the X-axis orientation of the piezoelectric layer 14b are different from each other, the spontaneous polarization direction (+Z-axis orientation) of the piezoelectric layer 14a and the spontaneous polarization direction (+Z-axis orientation) of the piezoelectric layer 14b are not opposite to each other. When the spontaneous polarization direction (+Z-axis orientation) of the piezoelectric layer 14a and the spontaneous polarization direction (+Z-axis orientation) of the piezoelectric layer 14b are substantially opposite to each other, this means it is acceptable that an angle between the +X-axis orientation of the piezoelectric layer 14a and the +X-axis orientation of the piezoelectric layer 14b is within a range of 5° or less.

Simulation

The frequency characteristics of the piezoelectric thin film resonator were simulated using a finite element method. The simulation conditions are as follows.

Thickness T of the piezoelectric layer 14: 300 nm
Lower electrode 12: Aluminum film with a thickness of 30 nm
Upper electrode 16: Aluminum film with a thickness of 30 nm The ratio of the thicknesses Ta of the piezoelectric layers 14a to the thicknesses Tb of the piezoelectric layers 14b was defined as Ta/Tb. When Ta/Tb=1, the thicknesses Ta and Tb of the piezoelectric layers 14a and 14b are both 150 nm.

Figure 4:
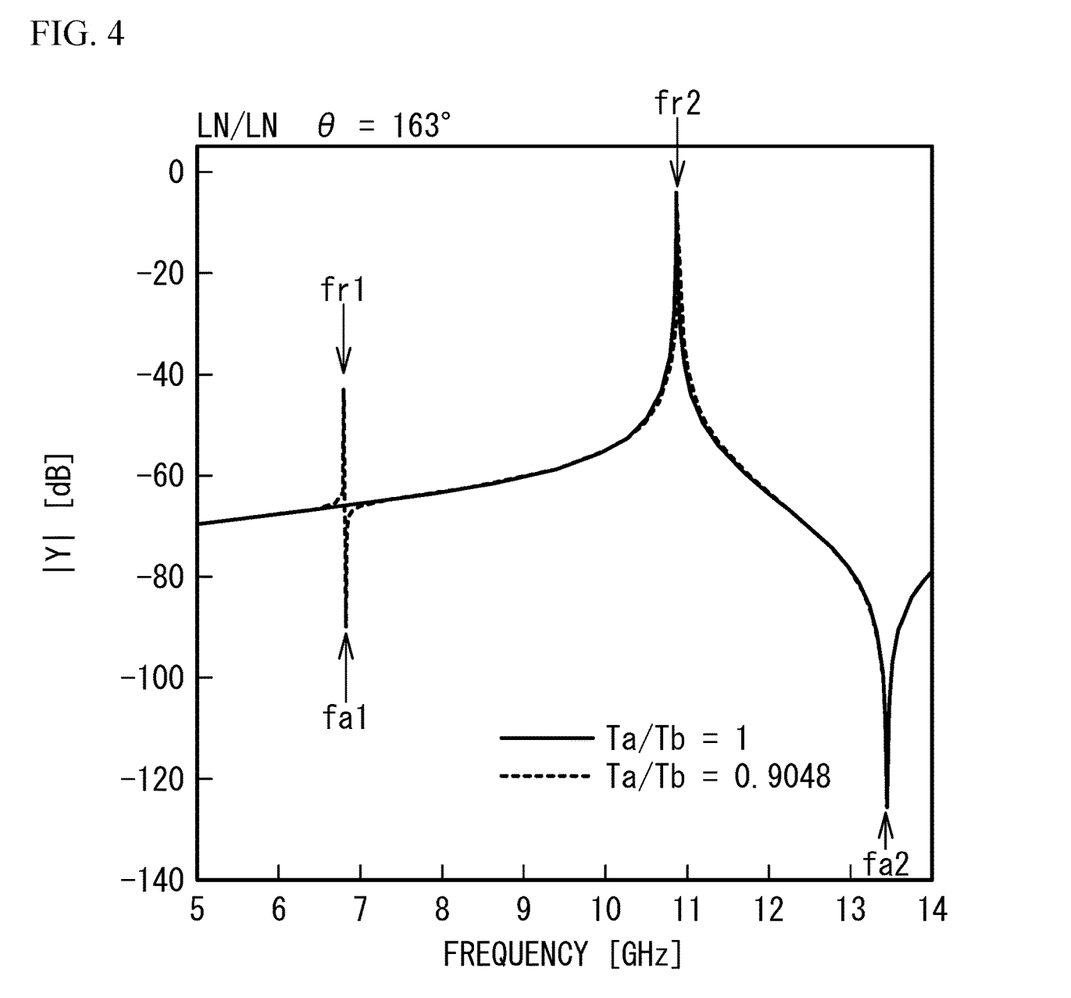
FIG. 4 is a graph of |Y| versus frequency in a second comparative example.

As a second comparative example, frequency characteristics in a case in which 163° rotated Y-cut lithium niobate substrates were used for both the piezoelectric layers 14a and 14b were simulated. The piezoelectric layer 14a and the piezoelectric layer 14b are bonded to each other so that polarization directions thereof are opposite to each other. FIG. 4 is a graph of |Y| versus frequency in the second comparative example. Here, |Y| is the absolute value of the admittance. As presented in FIG. 4, when Ta/Tb=1, a resonant frequency fr2 and an antiresonant frequency fa2 are observed as the response of the acoustic wave due to the second harmonic. No response of the fundamental wave is observed. When Ta/Tb=0.9048, the resonant frequency fr2 and the antiresonant frequency fa2 are observed as the response of the acoustic wave due to the second harmonic, and a resonant frequency fr1 and an antiresonant frequency fa1 are observed as the response of the acoustic wave due to the fundamental wave.

When the piezoelectric layers 14a and 14b are made of the same material as in the second comparative example, the fundamental wave, which is an unnecessary wave, is hardly excited by setting Ta/Tb=1. On the other hand, when Ta/Tb is set to a value different from 1, the fundamental wave, which is an unnecessary wave, is excited.

Figure 5:
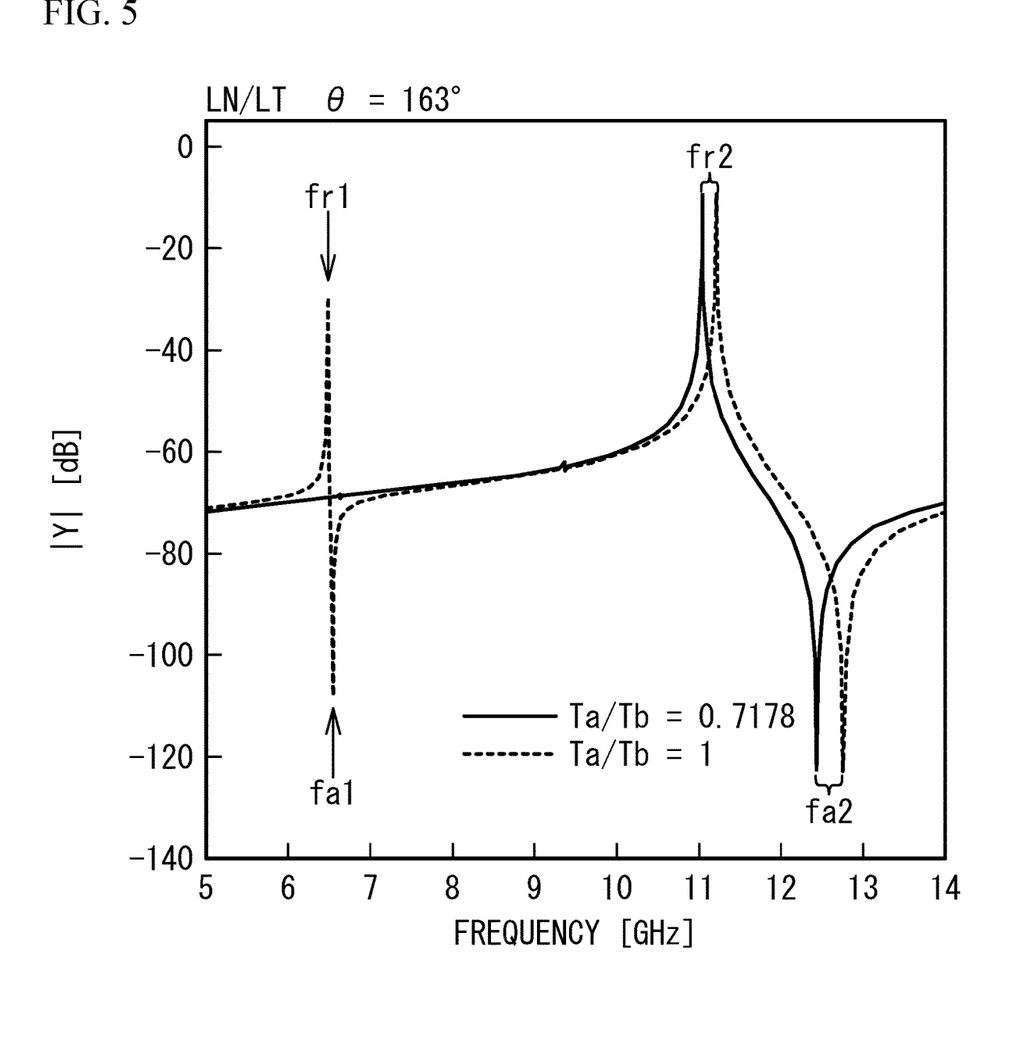
FIG. 5 is a graph of |Y| versus frequency in the first embodiment.

As the first embodiment, frequency characteristics in a case in which a 163° rotated Y-cut lithium niobate substrate was used for the piezoelectric layer 14a and a 163° rotated Y-cut lithium tantalate substrate was used for the piezoelectric layer 14b were simulated. The piezoelectric layer 14a and the piezoelectric layer 14b are bonded to each other so that polarization directions thereof are opposite to each other. FIG. 5 is a graph of |Y| versus frequency in the first embodiment. Here, |Y| is the absolute value of the admittance. As presented in FIG. 5, when Ta/Tb=1, the resonant frequency fr2 and the antiresonant frequency fa2 are observed as the response of the acoustic wave due to the second harmonic, and the resonant frequency fr1 and the antiresonant frequency fa1 are observed as the response of the acoustic wave due to the fundamental wave. When Ta/Tb=0.7178, the resonant frequency fr2 and the antiresonant frequency fa2 are observed as the response of the acoustic wave due to the second harmonic, and the response of the fundamental wave is not observed.

As described above, when a rotated Y-cut lithium niobate substrate is used for the piezoelectric layer 14a and a rotated Y-cut lithium tantalate substrate is used for the piezoelectric layer 14b, the fundamental wave can be suppressed by adjusting the thicknesses Ta to be smaller than the thicknesses Tb. Therefore, the electromechanical coupling coefficient $k^2$ of the fundamental wave was simulated for different Ta/Tb.

Figure 6A:
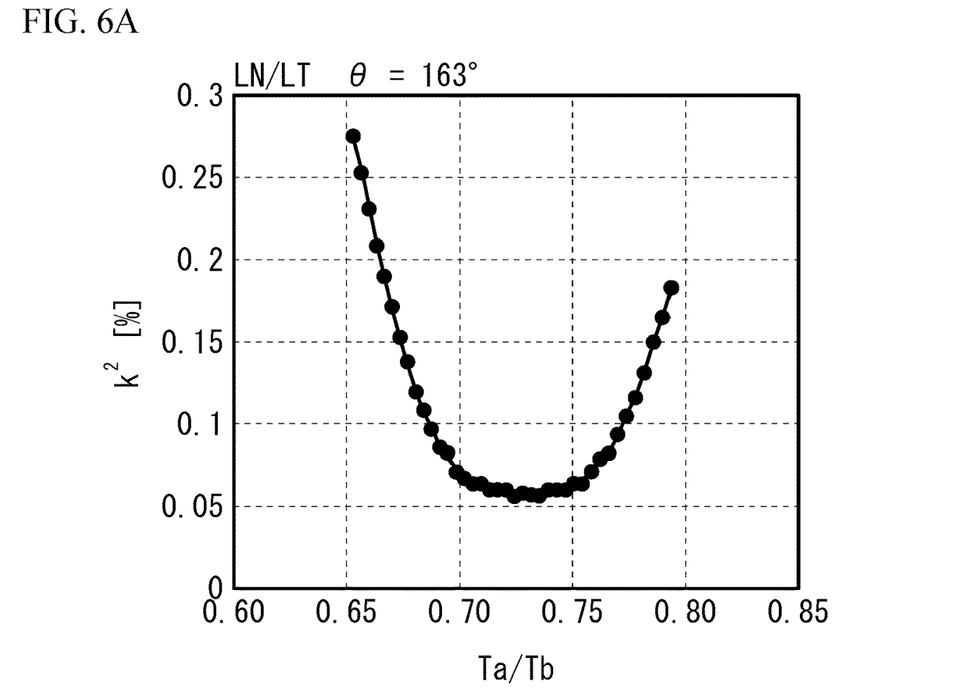
FIG. 6A is a graph of $k^2$ of a fundamental wave versus Ta/Tb.
Figure 6B:
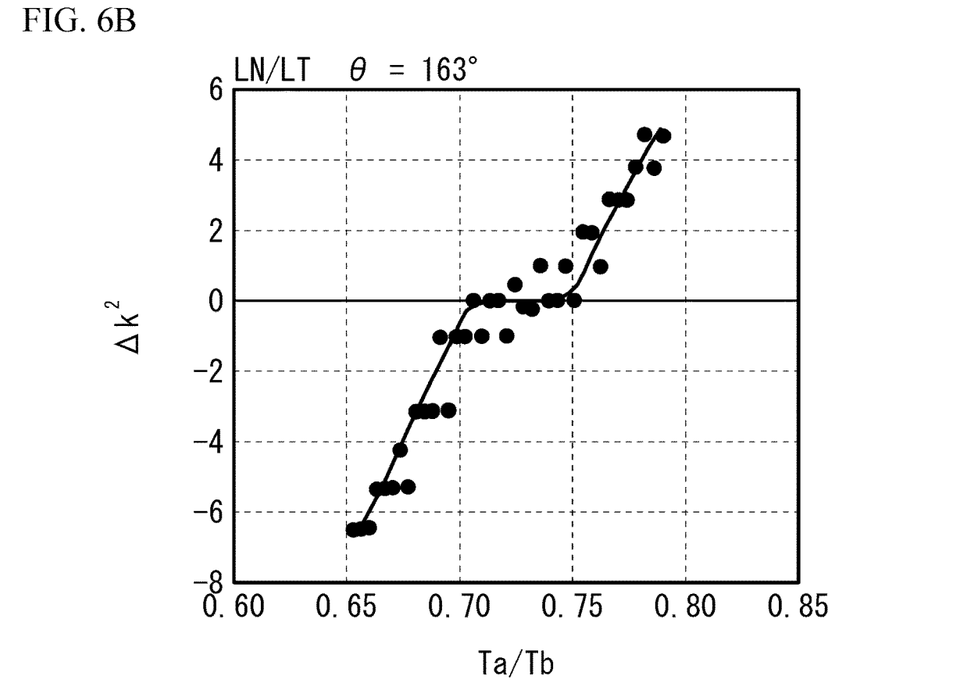
FIG. 6B is a graph of $\Delta k^2$ of the fundamental wave versus Ta/Tb.

FIG. 6A is a graph of $k^2$ of the fundamental wave versus Ta/Tb, and FIG. 6B is a graph of $\Delta k^2$ of the fundamental wave versus Ta/Tb. In FIG. 6A, black circles indicate simulated points, and a curve is a line connecting the black circles. In FIG. 6B, $\Delta k^2$ is the rate of change of $k^2$ with respect to Ta/Tb, and corresponds to the slope between the adjacent black circles in FIG. 6A.

As illustrated in FIG. 6A and FIG. 6B, the electromechanical coupling coefficient $k^2$ of the fundamental wave is about 0.06 in a range of Ta/Tb from 0.70 to 0.75. In a range of Ta/Tb of 0.7 or less, $k^2$ increases as Ta/Tb decreases, and in a range of Ta/Tb of 0.75 or greater, $k^2$ increases as Ta/Tb increases.

Figure 7:
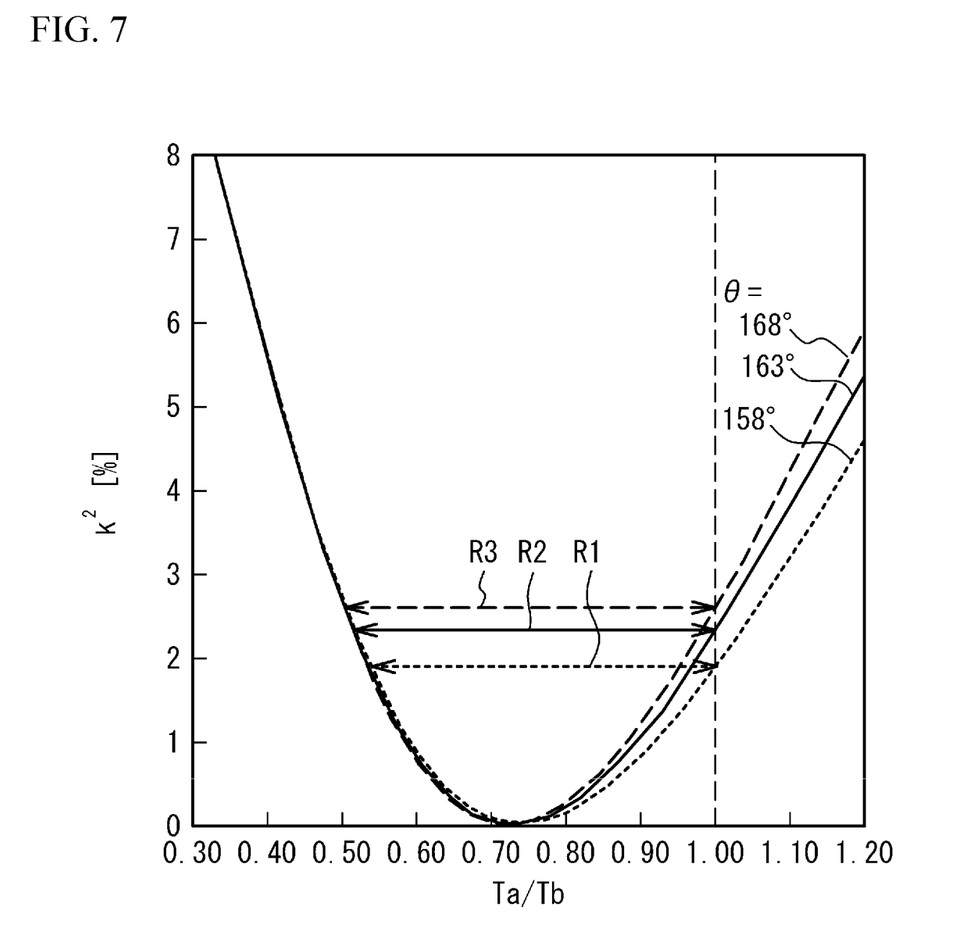
FIG. 7 is a graph of $k^2$ of the fundamental wave versus Ta/Tb.

By setting θ to 158°, 163° and 168° and varying Ta/Tb, $k^2$ of the fundamental wave was simulated. FIG. 7 is a graph of $k^2$ of the fundamental wave versus Ta/Tb. As presented in FIG. 7, $k^2$ of the fundamental wave is smallest in a range of Ta/Tb of 0.70 to 0.75 for any of θ of 158°, 163°, and 168°. Ranges R1 to R3 are ranges in which $k^2$ of the fundamental wave is smaller than $k^2$(Ta/Tb=1), which is $k^2$ when Ta/Tb=1, when θ is 158°, 163°, and 168°, respectively. When Ta/Tb is within the ranges R1 to R3, $k^2$ of the fundamental wave is equal to or less than $k^2$(Ta/Tb=1), which is $k^2$ when Ta/Tb=1.

Figure 8:
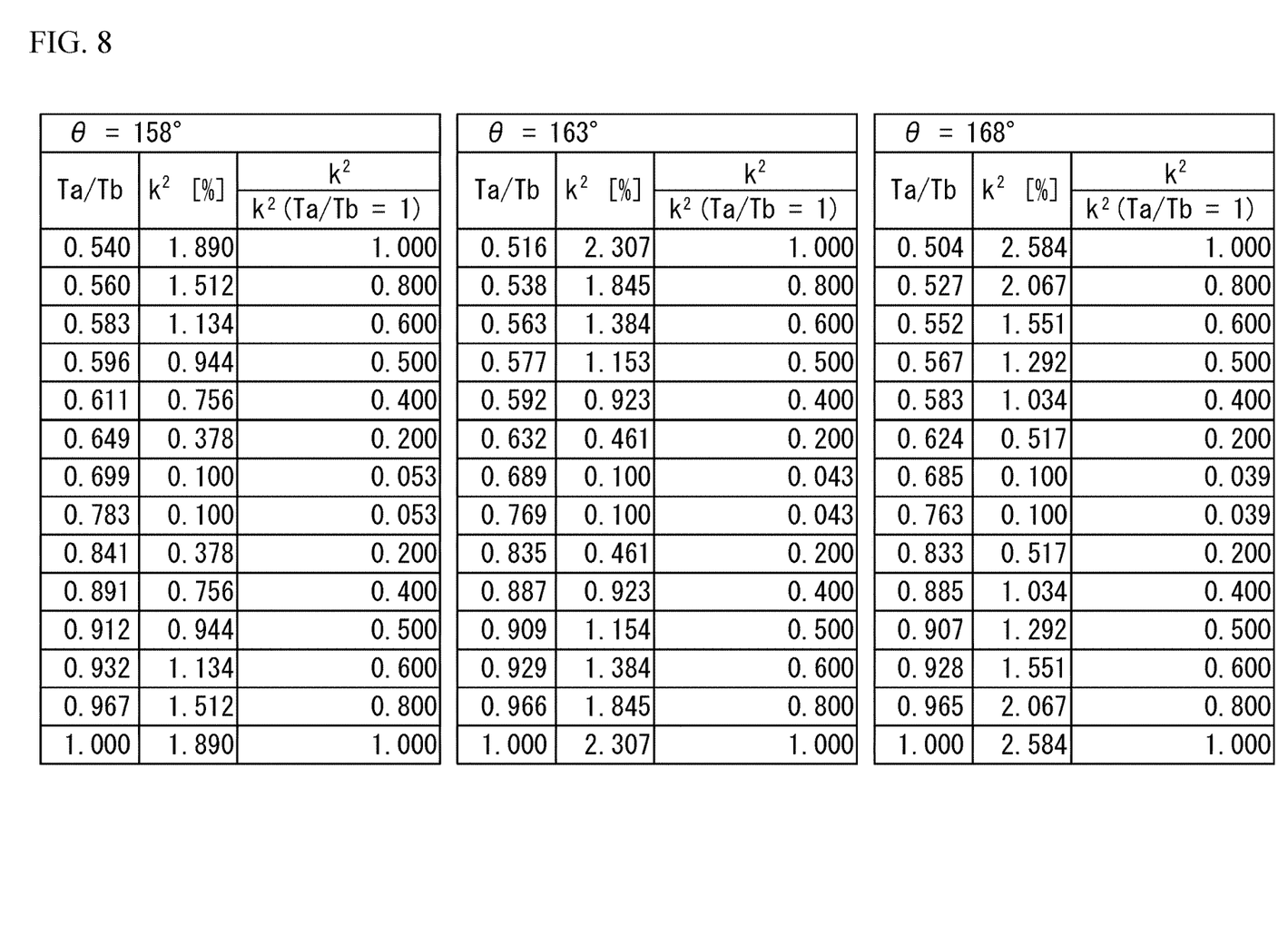
FIG. 8 presents $k^2$ and $k^2/k^2(Ta/Tb=1)$ with respect to Ta/Tb.

FIG. 8 presents $k^2$ and $k^2/k^2$(Ta/Tb=1) with respect to Ta/Tb. For θ of 158°, 163° and 168°, Ta/Tb at which $k^2/k^2$(Ta/Tb=1) is 1.0, 0.8, 0.6, 0.5, 0.4 and 0.2 and Ta/Tb at which $k^2$ is 0.1% are presented.

Figure 9A:
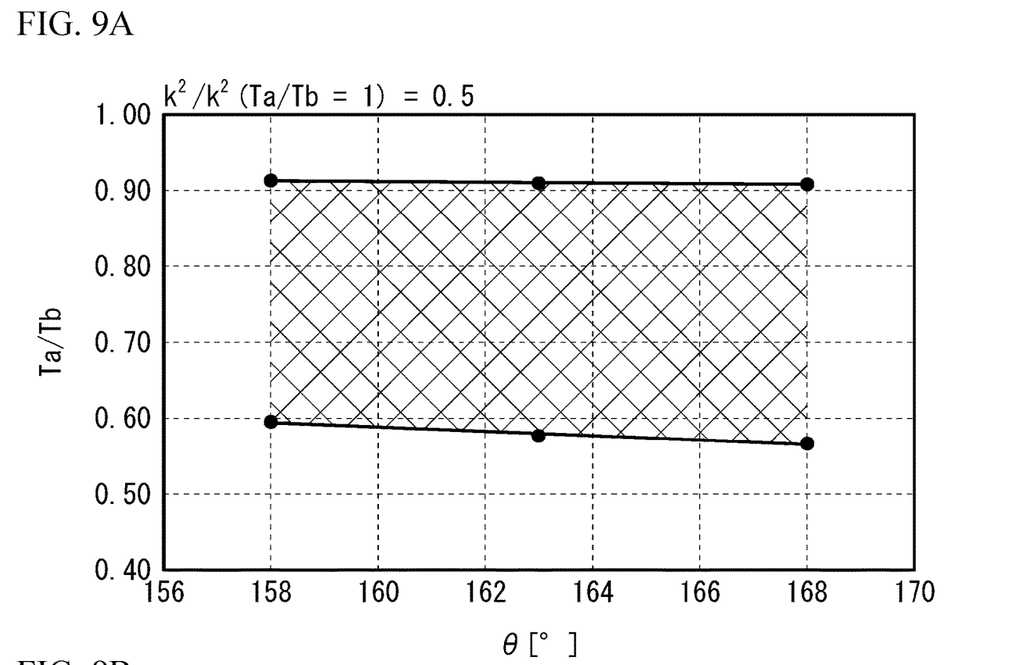
FIG. 9A and FIG. 9B are graphs of Ta/Tb versus θ.
Figure 9B:
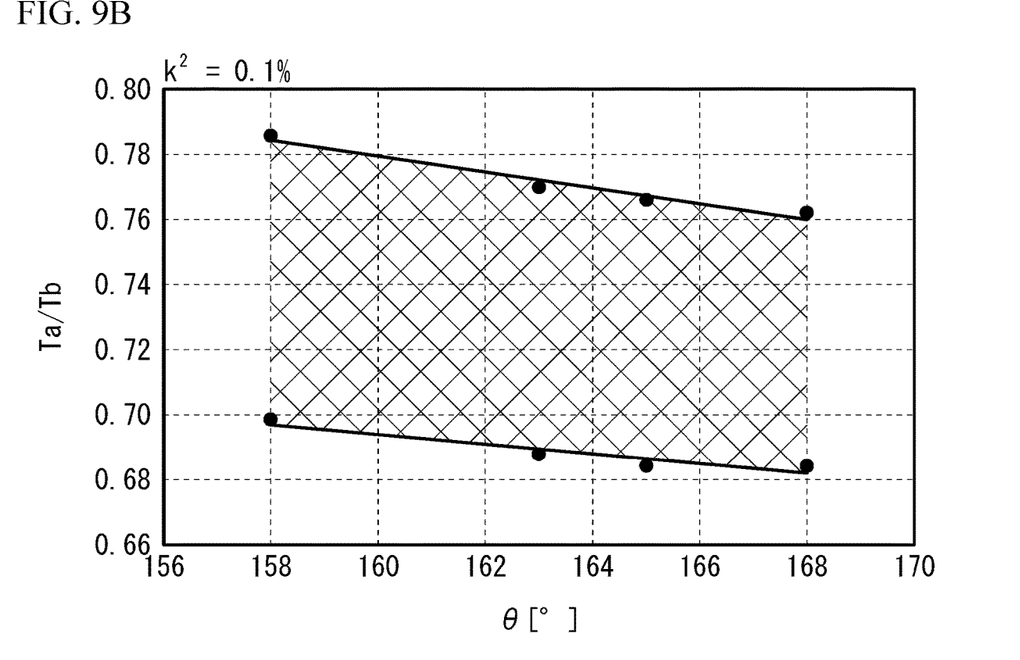

FIG. 9A and FIG. 9B are graphs of Ta/Tb versus θ. FIG. 9A presents a range of Ta/Tb in which $k^2/k^2$(Ta/Tb=1) is smaller than 0.5, and FIG. 9B presents a range in which $k^2$ of the fundamental wave is 0.1% or less. In FIG. 9A and FIG. 9B, black circles indicate simulation points, straight lines indicate approximate straight lines of the black circles, and hatches indicate ranges between the straight lines.

As presented in FIG. 9A and FIG. 9B, the range of Ta/Tb in which $k^2/k^2$(Ta/Tb=1) is smaller than 0.5, and the range of Ta/Tb in which $k^2$ of the fundamental wave is 0.1% or less do not depend much on θ.

In the first embodiment, as illustrated in FIG. 1A and FIG. 1B, the piezoelectric layer 14b (a first piezoelectric layer) and the piezoelectric layer 14a (a second piezoelectric layer) are stacked. The piezoelectric layer 14b is a rotated Y-cut lithium tantalate substrate and has a thickness Tb (a first thickness). The piezoelectric layer 14a is a rotated Y-cut lithium niobate substrate, has a thickness Ta (a second thickness), and has a spontaneous polarization direction substantially opposite to the spontaneous polarization direction of the piezoelectric layer 14b. The lower electrode 12 (a first electrode) is provided on the opposite surface of the piezoelectric layer 14b from the piezoelectric layer 14a. The upper electrode 16 (a second electrode) is provided on the opposite surface of the piezoelectric layer 14a from the piezoelectric layer 14b, and sandwich at least a part of the piezoelectric layer 14b and at least a part of the piezoelectric layer 14a between the upper electrode 16 and the lower electrodes 12. In such a structure, the thickness Ta is adjusted to be smaller than the thickness Tb. This configuration can reduce $k^2$ of the fundamental wave, thereby reducing unnecessary waves. Note that the term "the spontaneous polarization directions of the piezoelectric layers 14a and 14b are substantially opposite to each other" means the spontaneous polarization directions are opposite to each other to such an extent that the fundamental wave can be reduced. The angle between the spontaneous polarization directions of the piezoelectric layers 14a and 14b is preferably 1750 or greater and 1850 or less, more preferably 1770 or greater and 1830 or less, and further preferably 1780 or greater and 1820 or less.

As can be seen from FIG. 8 and FIG. 9B, the magnitude of the fundamental wave does not greatly depend on θ. Therefore, it is considered that the same results as in FIG. 8 to FIG. 9B can be obtained as long as the piezoelectric layer 14b is a 1580 or greater and 1680 or less rotated Y-cut lithium tantalate substrate and the piezoelectric layer 14a is a 1580 or greater and 1680 or less rotated Y-cut lithium niobate substrate. From FIG. 8, when the thickness Ta is equal to or greater than 0.5 times the thickness Tb, $k^2/k^2$(Ta/Tb=1) can be adjusted to be smaller than 1. In order to excite the acoustic wave of thickness-shear vibration and not to excite the acoustic wave of thickness extension vibration, θ of the piezoelectric layers 14b and 14a is preferably 1600 or greater and 1660 or less, and more preferably 161° or greater and 165° or less.

In FIG. 8, when Ta/Tb is 0.52 or greater and 0.97 or less, $k^2/k^2$(Ta/Tb=1) can be adjusted to be 0.8 or less. When Ta/Tb is 0.55 or greater and 0.94 or less, $k^2/k^2$(Ta/Tb=1) can be adjusted to be 0.6 or less. When Ta/Tb is 0.56 or greater and 0.92 or less, $k^2/k^2$(Ta/Tb=1) can be adjusted to be 0.5 or less. When Ta/Tb is 0.58 or greater and 0.90 or less, $k^2/k^2$(Ta/Tb=1) can be adjusted to be 0.4 or less. When Ta/Tb is 0.62 or greater and 0.85 or less, $k^2/k^2$(Ta/Tb=1) can be adjusted to be 0.2 or less. When Ta/Tb is 0.68 or greater and 0.78 or less, $k^2$ can be adjusted to be 0.1% or less.

To make the spontaneous polarization direction of the piezoelectric layer 14a and the spontaneous polarization direction of the piezoelectric layer 14b substantially opposite to each other, the angle between the X-axis orientation of the crystal orientations of the lithium tantalate substrate in the piezoelectric layer 14a and the X-axis orientation of the crystal orientations of the lithium niobate substrate in the piezoelectric layer 14b is preferably 5° or less, more preferably 2° or less.

The piezoelectric layers 14a and 14b are directly bonded to each other, and an interface between the piezoelectric layers 14a and 14b is flat (for example, the arithmetic surface roughness Ra is 10 nm or less). Thereby, the second harmonic can be excited in the piezoelectric layer 14.

First Variation of the First Embodiment

Figure 10A:
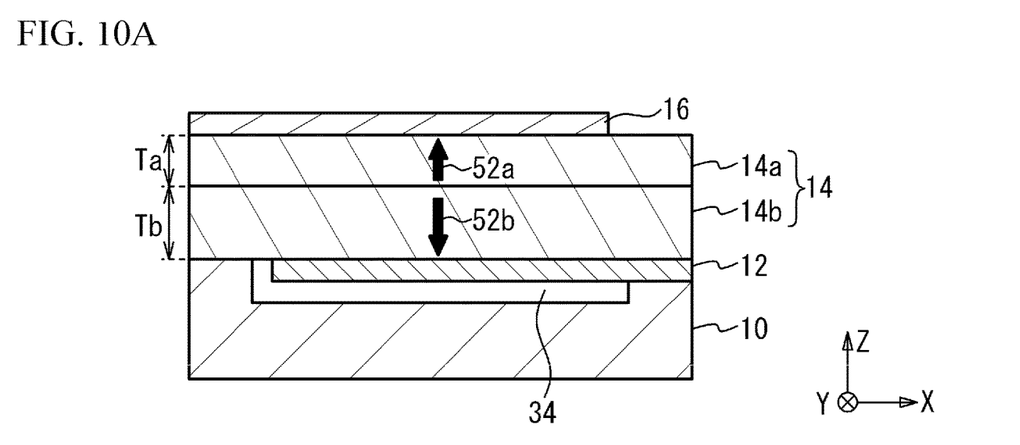
FIG. 10A to FIG. 10C are cross-sectional views of piezoelectric thin film resonators in accordance with first to third variations of the first embodiment, respectively.
Figure 10B:
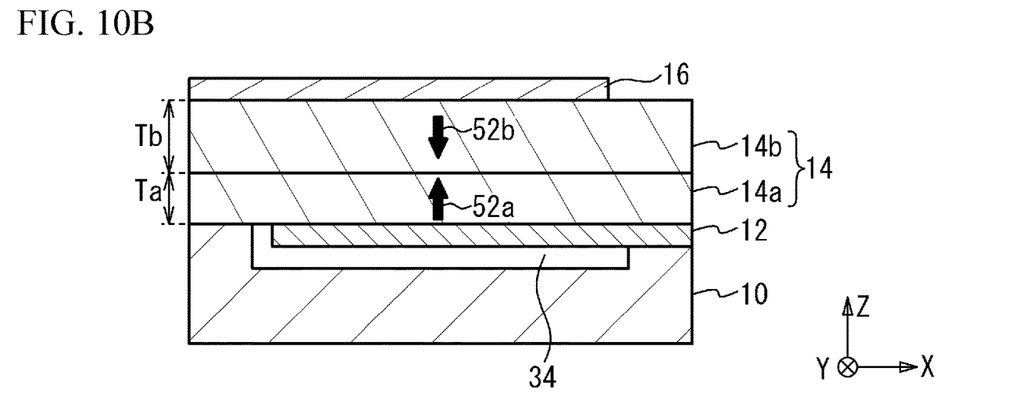
Figure 10C:
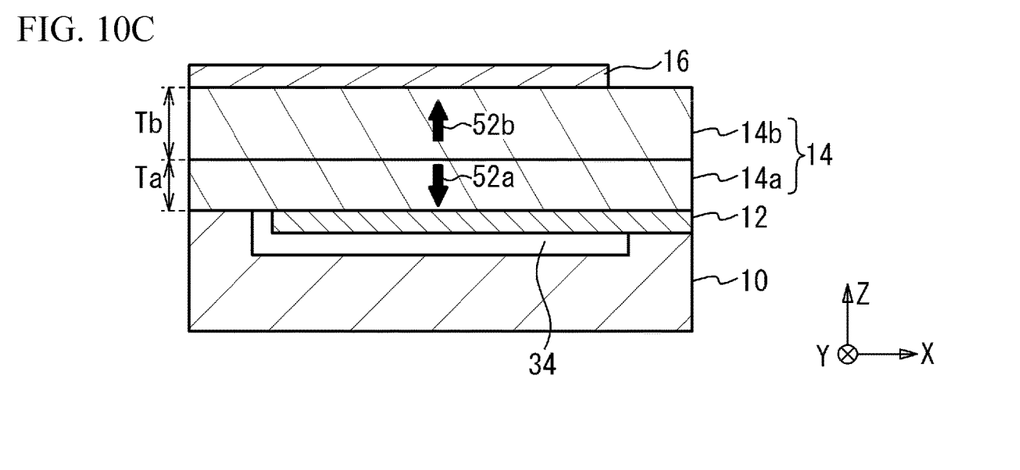

FIG. 10A to FIG. 10C are cross-sectional views of piezoelectric thin film resonators in accordance with first to third variations of the first embodiment, respectively. As illustrated in FIG. 10A, in the first variation of the first embodiment, the polarization direction 52a of the piezoelectric layer 14a is the upward direction, and the polarization direction 52b of the piezoelectric layer 14b is the downward direction. Other configurations are the same as those of the first embodiment, and a description thereof is omitted.

Second Variation of the First Embodiment

As illustrated in FIG. 10B, in the second variation of the first embodiment, the upper surface of the piezoelectric layer 14a and the lower surface of the piezoelectric layer 14b are bonded to each other, the lower electrode 12 is provided on the lower surface of the piezoelectric layer 14a, and the upper electrode 16 is provided on the upper surface of the piezoelectric layer 14b. The polarization direction 52a of the piezoelectric layer 14a is the upward direction, and the polarization direction 52b of the piezoelectric layer 14b is the downward direction. Other configurations are the same as those of the first embodiment, and a description thereof is omitted.

Third Variation of the First Embodiment

As illustrated in FIG. 10C, in the third variation of the first embodiment, the polarization direction 52a of the piezoelectric layer 14a is the downward direction, and the polarization direction 52b of the piezoelectric layer 14b is the upward direction. Other configurations are the same as those of the second variation of the first embodiment, and the description thereof will be omitted.

As in the first embodiment and the first variation thereof, the piezoelectric layer 14b may be provided between the substrate 10 (a support substrate) and the piezoelectric layer 14a. As in the second and third variations of the first embodiment, the piezoelectric layer 14a may be provided between the substrate 10 and the piezoelectric layer 14b. Ta/Tb with which the fundamental wave is reduced is determined by the amount of electric charge generated by spontaneous polarization when the fundamental wave is excited. Therefore, the preferable range of Ta/Tb obtained by the above simulation can also be applied to the first to third variations of the first embodiment. The preferable range of Ta/Tb can be applied without depending on the frequencies such as the resonant frequency of the piezoelectric thin film resonator, the materials of the lower electrode 12 and the upper electrode 16, and the piezoelectric layers 14a and 14b and the lower electrode 12 and the upper electrode 16.

Fourth Variation of the First Embodiment

Figure 11:
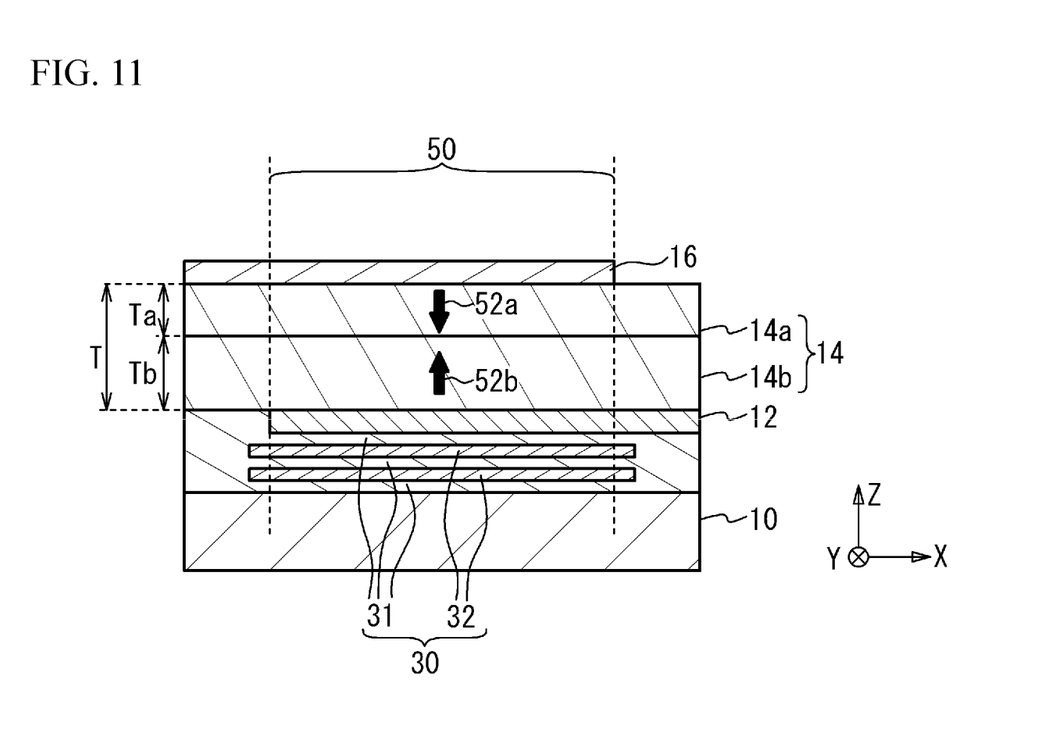
FIG. 11 is a cross-sectional view of a piezoelectric thin film resonator in accordance with a fourth variation of the first embodiment.

FIG. 11 is a cross-sectional view of a piezoelectric thin film resonator in accordance with a fourth variation of the first embodiment. As illustrated in FIG. 11, in the fourth variation of the first embodiment, an acoustic mirror 30 is provided between the substrate 10 and the lower electrode 12 instead of the air gap 34. In the acoustic mirror 30, a film 31 having low acoustic impedance and a film 32 having high acoustic impedance are alternately provided. The thickness of each of the films 31 and 32 is, for example, approximately λ/4 (λ is the wavelength of the acoustic wave). Thereby, the acoustic mirror 30 reflects the acoustic wave. The number of layers of the film 31 and the film 32 can be freely selected. The acoustic mirror 30 overlaps the resonance region 50, and has the same size as the resonance region 50 or larger than the resonance region 50. The film 31 of the acoustic mirror 30 is made of, for example, silicon oxide, silicon nitride, or the like. The film 32 is made of, for example, tungsten, tantalum, molybdenum, ruthenium, or the like.

As in the first embodiment and the first to third variations thereof, the piezoelectric thin film resonator may be an FBAR in which the air gap 34 reflects an acoustic wave. As in the fourth variation of the first embodiment, the piezoelectric thin film resonator may be an SMR in which the acoustic mirror 30 reflects an acoustic wave. Although an example in which the planar shape of the resonance region 50 is rectangular has been described, the resonance region 50 may have an elliptical shape or a polygonal shape such as a pentagonal shape.

Second Embodiment

Figure 12A:
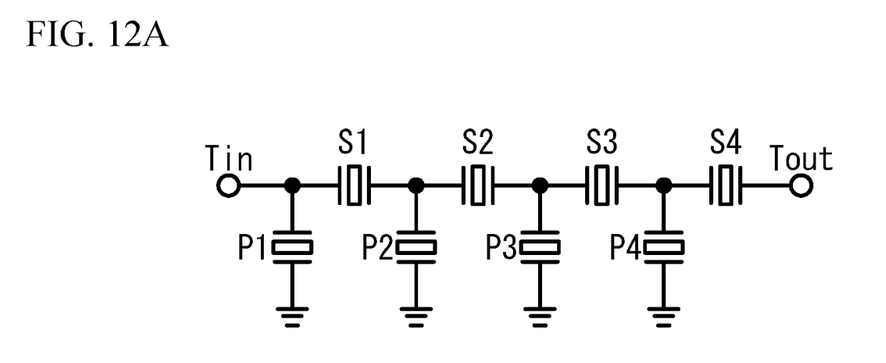
FIG. 12A is a circuit diagram of a filter in accordance with a second embodiment.

A second embodiment is an exemplary filter and an exemplary duplexer using the piezoelectric thin film resonator of the first embodiment. FIG. 12A is a circuit diagram of a filter in accordance with the second embodiment. As illustrated in FIG. 12A, one or more series resonators S1 to S4 are connected in series between an input terminal Tin and an output terminal Tout. One or more parallel resonators P1 to P4 are connected in parallel between the input terminal Tin and the output terminal Tout. The piezoelectric thin film resonator of the first embodiment can be used for at least one of the following resonators: the one or more series resonators S1 to S4 and the one or more parallel resonators P1 to P4. The number of resonators of the ladder-type filter can be freely selected.

Figure 12B:
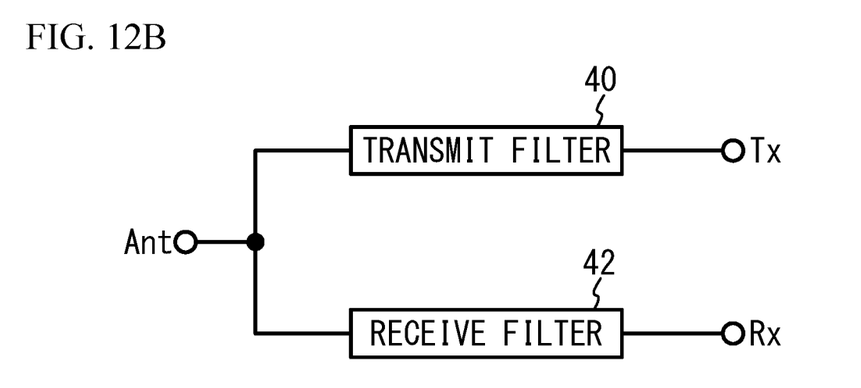
FIG. 12B is a circuit diagram of a duplexer in accordance with a first variation of the second embodiment.

FIG. 12B is a circuit diagram of a duplexer in accordance with a first variation of the second embodiment. As illustrated in FIG. 12B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 or the receive filter 42 may be the filter of the second embodiment.

Although the duplexer has been described as an example of the multiplexer, a triplexer or a quadplexer may be used.

Although the embodiment of the present invention has been described in detail above, the present invention is not limited to the specific embodiment, and various modifications and changes can be made within the scope of the gist of the present invention described in the claims.

What is claimed is:
1. An acoustic wave device, comprising:
a first piezoelectric layer that is a rotated Y-cut lithium tantalate substrate and has a first thickness;
a second piezoelectric layer that is a rotated Y-cut lithium niobate substrate, is stacked on the first piezoelectric layer, has a second thickness that is less than the first thickness, and has a spontaneous polarization direction that is substantially opposite to a spontaneous polarization direction of the first piezoelectric layer;
a first electrode provided on an opposite surface of the first piezoelectric layer from the second piezoelectric layer; and a second electrode that is provided on an opposite surface of the second piezoelectric layer from the first piezoelectric layer, at least a part of the first piezoelectric layer and at least a part of the second piezoelectric layer being interposed between the first electrode and the second electrode.

2. The acoustic wave device according to claim 1,
wherein the first piezoelectric layer is a 1580 or greater and 1680 or less rotated Y-cut lithium tantalate substrate,
wherein the second piezoelectric layer is a 1580 or greater and 1680 or less rotated Y-cut lithium niobate substrate, and
wherein the second thickness is equal to or greater than 0.5 times the first thickness.

3. The acoustic wave device according to claim 2, wherein the second thickness is equal to or greater than 0.56 times the first thickness and is equal to or less than 0.92 times the first thickness.

4. The acoustic wave device according to claim 2, wherein the second thickness is equal to or greater than 0.68 times the first thickness and is equal to or less than 0.78 times the first thickness.

5. The acoustic wave device according to claim 2, wherein an angle between an X-axis orientation of crystal orientations of the rotated Y-cut lithium tantalate substrate in the first piezoelectric layer and an X-axis orientation of crystal orientations of the rotated Y-cut lithium niobate substrate in the second piezoelectric layer is 5° or less.

6. The acoustic wave device according to claim 1, wherein the first piezoelectric layer and the second piezoelectric layer are directly bonded to each other.

7. The acoustic wave device according to claim 1, further comprising:
a support substrate,
wherein the first piezoelectric layer is provided between the support substrate and the second piezoelectric layer.

8. The acoustic wave device according to claim 1, further comprising:
a support substrate,
wherein the second piezoelectric layer is provided between the support substrate and the first piezoelectric layer.

9. A filter comprising:
the acoustic wave device according to claim 1.

10. A multiplexer comprising:
the filter according to claim 9.

* * * * *